United States Patent [19]

Baliga et al.

[11] 4,443,931

[45] Apr. 24, 1984

[54] METHOD OF FABRICATING A SEMICONDUCTOR DEVICE WITH A BASE REGION HAVING A DEEP PORTION

[75] Inventors: Bantval J. Baliga, Clifton Park; Michael S. Adler, Schenectady, both of N.Y.

[73] Assignee: General Electric Company, Schenectady, N.Y.

[21] Appl. No.: 392,870

[22] Filed: Jun. 28, 1982

[51] Int. Cl.$^3$ ............................................. H01L 21/22
[52] U.S. Cl. ........................................ 29/571; 29/578; 148/187
[58] Field of Search .................. 29/571, 578; 148/187; 357/23 VD

[56] References Cited

U.S. PATENT DOCUMENTS

| | | | |
|---|---|---|---|
| 4,170,502 | 10/1979 | Watakabe | 148/187 X |
| 4,181,542 | 1/1980 | Yoshida et al. | 148/187 |
| 4,199,380 | 4/1980 | Farrell et al. | 148/187 X |
| 4,292,728 | 10/1981 | Endo | 29/571 |
| 4,345,265 | 8/1982 | Blanchard | 357/23 VD |

OTHER PUBLICATIONS

J. P. Stengl, H. Strack, J. Tihanyi, "Power MOS Transistors For 1000 V Blocking Voltage", Technical Digest of the 1981 (IEEE) IEDM, pp. 422–425.
G. Bell & W. Ladenhauf, "SIPMOS Technology, an Example of VLSI Precision Realized With Standard LSI for Power Transistors", Siemens Forsch.-u.Ent-wickl.-Ber.Bd. 9(1980), No. 4, pp. 190–194.

*Primary Examiner*—G. Ozaki
*Attorney, Agent, or Firm*—Charles E. Bruzga; James C. Davis, Jr.; Marvin Snyder

[57] ABSTRACT

A semiconductor device, such as a MOSFET or IGR, is fabricated with a base region having a deep portion for reducing parasitic currents. A wafer is provided having an N type layer on an appropriately doped substrate. A first oxide layer is formed on the wafer, and a refractory electrode layer is deposited on the first oxide layer. A first window is opened in the refractory electrode layer, and then silicon nitride is deposited on the wafer. A second window is opened in the silicon nitride layer, within the first window. A deep P+ base region is diffused into the wafer through the second window, and then a second oxide layer is selectively grown in the second window. The silicon nitride layer is selectively removed, thereby opening a third window, defined by the second window and the second oxide layer situated within the second window. A shallow P base region is diffused into the wafer through the third window, followed by diffusion of a shallow N+ region through the third window. The P-N junction between the N+ region and the deep P+ base region terminates at the surface of the wafer. The second oxide layer is removed, exposing the P-N junction, and the wafer is metallized, thereby implementing an electrical short across the P-N junction.

9 Claims, 14 Drawing Figures

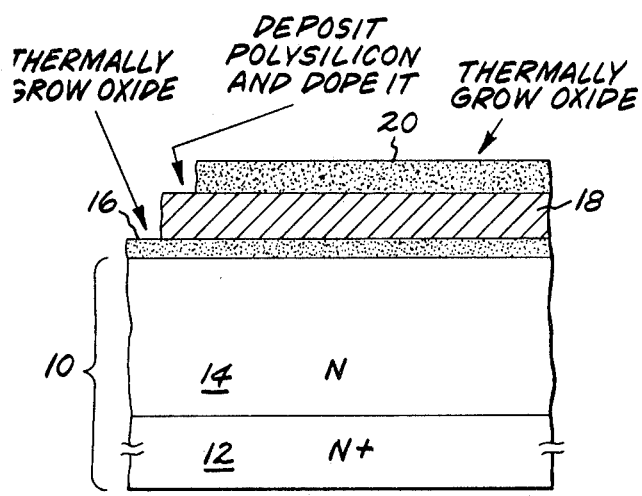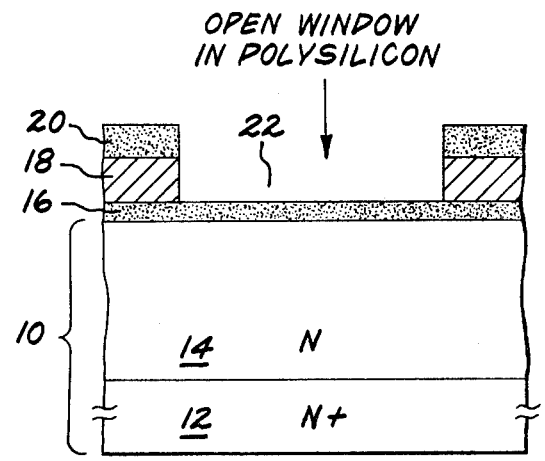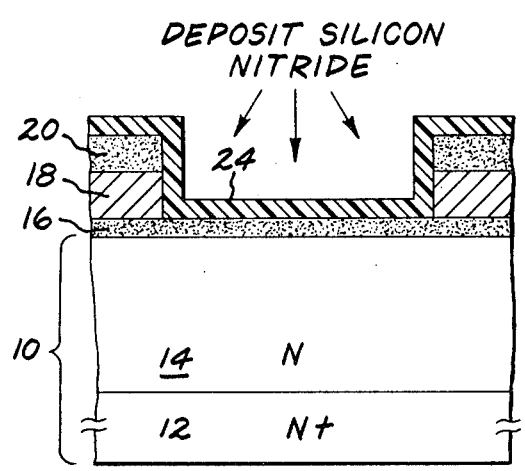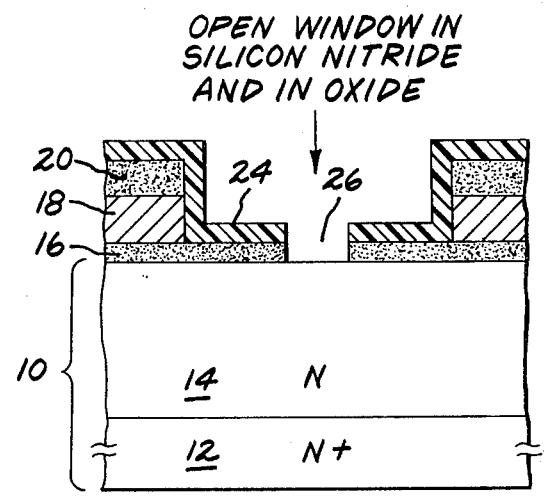

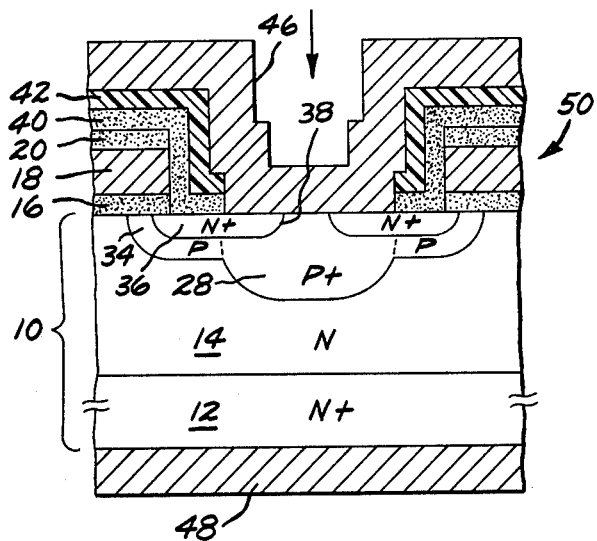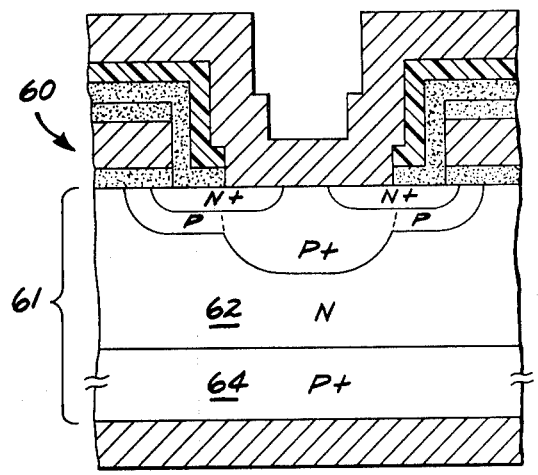

METHOD OF FABRICATING A SEMICONDUCTOR DEVICE WITH A BASE REGION HAVING A DEEP PORTION

BACKGROUND OF THE INVENTION

Our invention relates to a method of fabricating a semiconductor device with a base region having a deep portion for reducing parasitic device currents, and, more particularly, to such method wherein an electrical short (i.e., short circuit) is formed across a P-N junction that is located between the base region and a region of opposite dopant type, the electrical short assisting in reducing parasitic currents in the device.

A prior art semiconductor device, comprising a MOSFET, is described in an article by G. Bell and W. Ladenhauf, "SIPMOS Technology, an Example of VLSI Precision Realized With Standard LSI for Power Transistors", Siemens Forsch.-u.Entwickl.-Ber. Bd.9(1980) Nr.4, pages 190–194 (FIG. 7). The MOSFET therein described includes N+ and N− drain regions (the supercripts "+" and "−" referring to relative doping concentrations), and N+ source region, and a P type base region. The MOSFET is of the enhancement mode type; that is, an N type conduction channel is induced within part of the P type base region only when the gate of the MOSFET is biased above a threshold voltage. The P type base region contains a deep P+ portion as well as a shallow P portion. An electrical short is formed across the P-N junction extant between the N+ source region and P type base region to suppress parasitic current that would otherwise result if such P-N junction were to become biased in a manner whereby the N+ source injected electrons into the P type base region. The deep P+ portion of the P type base region helps to prevent the N+ source region from injecting electrons into the P type base region.

In the method of fabricating the prior art MOSFET, as described in the foregoing article, the deep P+ portion of the P type base region is diffused into a wafer of semiconductor material through a first window of a diffusion mask. Then the shallower P portion of the P type base region is diffused into the wafer through a second window of a second diffusion mask, such second window being larger than the first window and centered about the first window. Thereafter, the N+ source region is diffused into the wafer through the second window. Due to processing constraints, the thus-formed N+ source region covers the deep P+ portion, leaving no portion of the P-N junction extant between the N+ source region and the P+ deep portion exposed at the upper surface of the wafer. As a consequence, the N+ source region must be etched through to the deep P+ portion in order to expose part of such P-N junction before an electrical short can be formed across the P-N junction.

The presence of the foregoing etching step increases the complexity of fabricating a MOSFET by requiring a photolithographic mask to be meticulously aligned over previously-formed features of the MOSFET. The inclusion of such alignment procedure decreases the yield of operable MOSFETs and, hence, increases their cost.

SUMMARY OF THE INVENTION

Accordingly, an object of our invention is to provide a method of fabricating a semiconductor device with a base region having a deep portion, the method not requiring etching through a region of the device to expose a P-N junction across which an electrical short is formed.

Briefly, in accordance with an illustrative embodiment of our invention, we provide a method of fabricating a semiconductor device comprising a MOSFET. Starting with a wafer of semiconductor material comprising an N+ substrate with an N layer thereon, we form a first oxide layer on the upper surface of the wafer and then form a refractory electrode layer atop the first oxide layer. We open a first window in the refractory electrode layer. We next deposit a layer of silicon nitride over the thus-formed device, and open a second window in the silicon nitride, within the first window. We diffuse into the wafer through the second window a P+ base region of predetermined depth, and then form a second oxide layer within the second window, preferably by thermal oxidation of wafer material. The silicon nitride does not oxidize, however. We then selectively remove the silicon nitride layer, thereby opening a third window, defined by the second window and the second oxide layer situated within the second window. We diffuse into the wafer through the third window a P base region of lesser depth than the P+ base region, and then diffuse into the wafer through the third window an N+ source region of lesser depth than the P base region. Accordingly, the P-N junction between the N+ source region and the deep P+ base region terminates at the upper surface of the wafer. We remove the second oxide layer, and metallize the thus-exposed upper surface of the wafer, thereby implementing an electrical short across such P-N junction without the need for etching through the N+ source region to expose the P-N junction.

BRIEF DESCRIPTION OF THE DRAWINGS

While the specification concludes with claims particularly pointing out and distinctly claiming the subject matter which we regard as our invention, it is believed that the invention will be better understood from the following description, considered in connection with the drawings, in which:

FIGS. 1–13 are schematic views in cross-section of selected steps of fabricating one cell of a MOSFET in accordance with our invention; and FIG. 14 is a schematic view in cross-section illustrating a cell of an alternative semiconductor device fabricated in accordance with our invention.

DESCRIPTION OF THE PREFERRED EMBODIMENT

Figure 5:
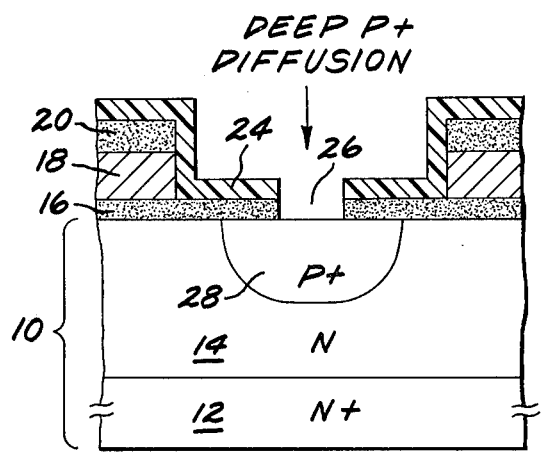

A method of fabricating a MOSFET in accordance with a preferred embodiment of our invention will now be described in connection with FIGS. 1–13, illustrating various steps of fabricating a cell (or repeated structure) of a MOSFET.

As illustrated in FIG. 1, we initially provide a wafer 10, preferably of silicon semiconductor material, comprising an N+ substrate 12 having an N layer 14 thereon. N layer 14 may typically be epitaxially grown on substrate 12, and is typically on the order of 100 microns thick. We then form an oxide layer 16 (i.e., silicon dioxide) on the upper surface of wafer 10, preferably by thermal growth resulting from placing wafer 10 in a heated furnace together with an oxidizing ambient. However, other insulating layers could be used in lieu of oxide layer 16, or oxide layer 16 could instead be formed by other processes, such as by deposition on wafer 10, rather than being thermally grown thereon. Atop oxide layer 16 we deposit a layer of polysilicon 18 (shown partially removed), or other refractory material, suitably using a process known as Low Pressure Chemical Vapor Deposition(LPCVD). We prefer to dope the polysilicon layer 18 with an appropriate dopant at this stage to make it highly conductive, so that it can function as a gate electrode in the completed MOSFET. A suitable dopant is the N type dopant phosphorus. We then form, as by thermal growth, oxide layer 20 (shown partially removed), e.g., silicon dioxide, atop polysilicon layer 18, preferably by placing wafer 10 in a heated furnace together with an oxidizing ambient. Oxide layer 20 should be thicker than oxide layer 16, for a reason that will become apparent below. Oxide layer 20 is not essentially needed to practice our invention, however, but we prefer to use it to provide dielectric isolation between the conductive polysilicon layer 18 and source metallization (not yet shown) which will be above the polysilicon layer 18.

As illustrated in FIG. 2, we open a window 22 in oxide layer 20 and polysilicon layer 18, using photolithograhic etching techniques. The shape of window 22 establishes the shape of the cell of the MOSFET being fabricated; e.g., a round window 22 results in a round cell. Such cell can have various shapes, with an elongated, rectangular shape being preferred.

As illustrated in FIG. 3, we next deposit a layer of silicon nitride ($Si_3N_4$) 24 on the MOSFET cell of FIG. 2, preferably by LPCVD of a reaction product of silane ($SiH_4$) and ammonia ($NH_3$). We prefer that silicon nitride layer 24 be separated from the upper surface of wafer 10 by oxide layer 16, as illustrated, to avoid mechanical stresses in wafer 10 which tend to develop at a silicon-silicon nitride interface.

As illustrated in FIG. 4, we open window 26 in silicon nitride layer 24 and oxide layer 16. A suitable procedure we use to accomplish this is to etch silicon nitride layer 24 with phosphoric acid($H_3PO_4$) heated to about 180° C., and etch oxide layer 16 in a solution of hydrofluoric acid (HF) and water ($H_2O$), in a ratio of about 1-10 (HF to $H_2O$) by volume.

As illustrated in FIG. 5, we next diffuse a P type dopant through window 26 into wafer 10 to implement a deep P+ base region 28 of predetermined depth (e.g., 5 microns).

Figure 6:
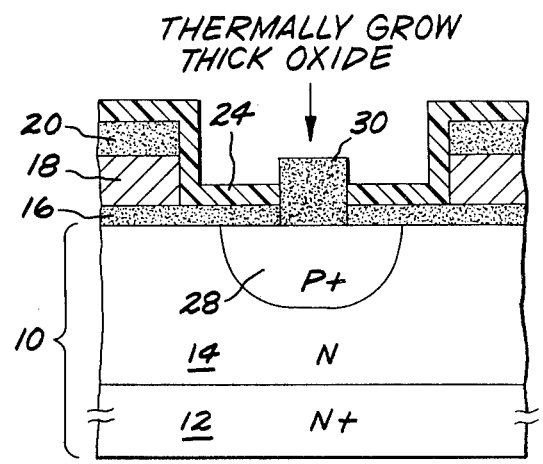

As next illustrated in FIG. 6, we form an oxide layer 30 in window 26, preferably by thermal growth resulting from placing wafer 10 in a heated furnace together with an oxidizing ambient. Oxide layer 30 must be thicker than oxide layer 16, for a reason that will become apparent below.

Figure 7:
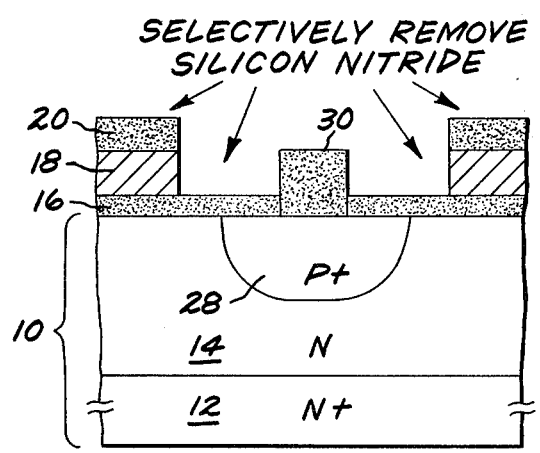

As illustrated in FIG. 7, we selectively remove silicon nitride layer 24, for example, by placing wafer 10 in phosphoric acid heated to about 180° C. This procedure does not remove any of the oxide layers, i.e., layers 16, 20 and 30.

Figure 8:
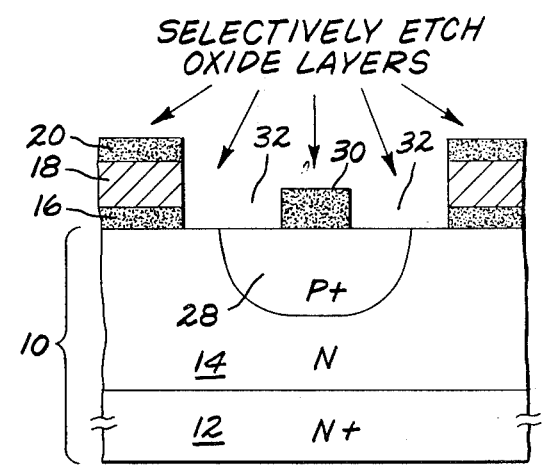

As next illustrated in FIG. 8, we selectively remove exposed portions of oxide layer 16 and portions of both oxide layers 20 and 30. This procedure is suitably accomplished by immersing wafer 10 in a solution of hydrofluoric acid (HF) and water ($H_2O$) in a ratio of about 1-10 (HF to $H_2O$) by volume, for sufficient time to remove the entire exposed portions of oxide layer 16. Less than the entire oxide layers 20 and 30 are removed, however, because they were both originally thicker than oxide layer 16. By removing the previously-exposed portion of oxide layer 16, a window 32 is opened, defined by window 22 (FIG. 2) and oxide layer 30 situated within window 22.

Figure 9:
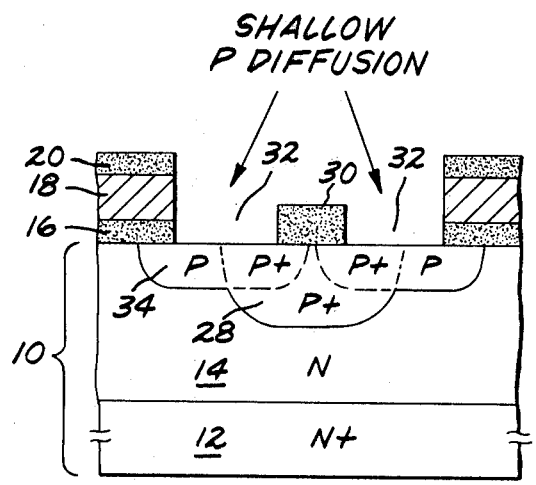
Figure 10:
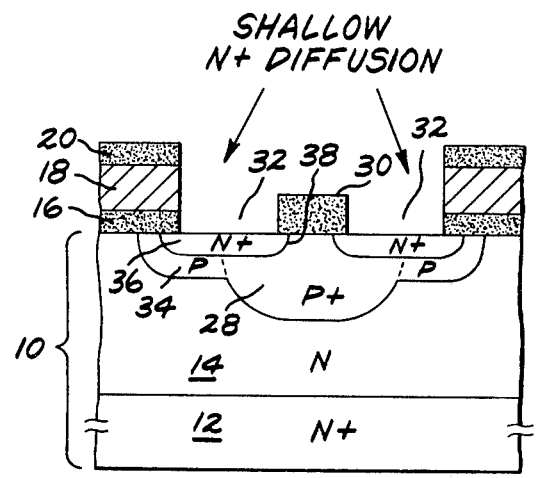

As illustrated in FIG. 9, we then diffuse a P type dopant through window 32 into wafer 10 to form a P base region 34 of shallow depth (e.g., 2 microns). Thereafter, as illustrated in FIG. 10, we diffuse an N type dopant through window 32 into wafer 10 to form an N+ source region 36 of shallow depth (e.g., 1 micron). As shown in FIG. 10, P-N junction 38, extant between N+ source 36 and deep P+ base portion 28, has a portion terminating at the upper surface of wafer 10, beneath oxide layer 30.

Figure 11:
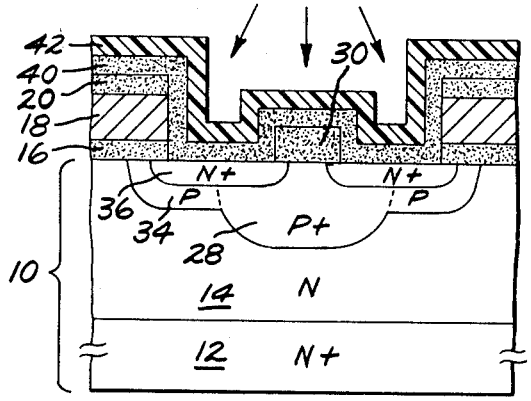

As next illustrated in FIG. 11, we form an oxide layer 40 atop the MOSFET cell of FIG. 10, preferably by Low Pressure Chemical Vapor Deposition(LPCVD), and then deposit a layer of silicon nitride 42 atop oxide layer 40, preferably by LPCVD of a reaction product of silane ($SiH_4$) and ammonia ($NH_3$).

Figure 12:
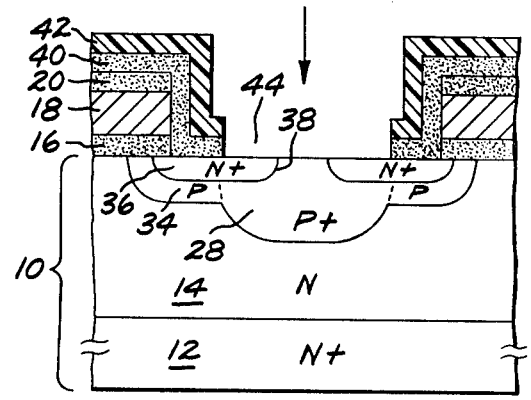

As illustrated in FIG. 12, we open window 44 in silicon nitride layer 42 and oxide layer 40 to expose P-N junction 38, as well as part of N+ source region 36.

As illustrated in FIG. 13, we apply source metallization 46 to wafer 10, for example, by evaporation of aluminum on the wafer 10. Drain metallization 48 may also be applied at this time, to complete the cell of a MOSFET 50, as illustrated in FIG. 13. Oxide layer 40 and silicon nitride 42, together with oxide layer 20, provide dielectric isolation between polysilicon layer 18 and source metallization 46. Silicon nitride layer 42 advantageously serves as a sodium barrier between source metallization 46 and wafer 10. Layers 20, 40 and 42 could be replaced, however, by one or more different insulating layers, as long as adequate dielectric isolation is provided between polysilicon layer 18 and source metallization 46.

As can be appreciated from the foregoing description, an electrical short in MOSFET 50 is automatically formed across P-N junction 38 by source metallization 46, without requiring that N+ source region 38 be etched through to deep P+ base region 28, in contrast with the prior art method, described above.

In carrying out our invention, silicon nitride layer 24 (FIG. 3 et seq.) has been found to possess three essential properties which make it suitable for use in fabricating a semiconductor device with a base region having a deep portion. First, silicon nitride resists oxidation when placed in a heated furnace together with an oxidizing ambient, as when growing oxide layer 30 (FIG. 6). Second, silicon nitride can be selectively removed without removing silicon dioxide (FIG. 7). Third, silicon nitride serves as a barrier to dopant impurities which are diffused into wafer 10 (FIG. 5). Materials other than silicon nitride that possess the foregoing properties can be utilized in lieu of silicon nitride layer 24 in carrying out our invention.

Our invention can be used to fabricate semiconductor devices, other than MOSFETs, which have a base region with a deep portion. Another suitable device is an insulated gate rectifier (IGR), illustrated in FIG. 14. IGR 60 is essentially identical to MOSFET 50 (FIG. 13) except that in IGR 60 a wafer is provided having an N layer 62 on a P+ substrate 64, in contrast with wafer 10 of MOSFET 50 having N type layer 14 on N+ type drain substrate region 12. Accordingly, IGR 60 can be fabricated in accordance with the foregoing description of the fabrication of MOSFET 50, taking into account the differences in substrate dopant type.

Details of the structure and operation of an IGR, such as IGR 60, are described in commonly-assigned U.S. patent application Ser. No. 212,181, filed Dec. 2, 1980, by B. J. Baliga, entitled, "Gate Enhanced Rectifier" (referred to herein as a IGR), now abandoned in favor of continuation application Ser. No. 483,089, filed on Apr. 7, 1983, and in commonly-assigned U.S. patent application Ser. No. 365,076, filed Apr. 5, 1982, by M. S. Adler and B. J. Baliga, entitled, "Insulated Gate Rectifier With Improved Current-Carrying Capability".

In summary, we have described a preferred embodiment of a method of fabricating a semiconductor device with a base region having a deep portion, the method not requiring etching through a region of the device to expose a P-N junction across which an electrical short is formed. Those skilled in the art can readily appreciate that various modifications and substitutions can be made in other embodiments of our invention without departing from the spirit and scope of our invention. For example, complementary semiconductor devices could be fabricated, in which P type material is used rather than N type material, and vice-versa. It is therefore intended that the appended claims cover all such modifications and variations.

What is claimed as our invention and desired to be secured by Letters Patent of the United States is:

1. A process of fabricating a semiconductor device with a base region having a deep portion, comprising the steps of:
   (a) forming an insulating layer on the upper surface of a wafer of semiconductor material comprised of a substrate with a layer of one dopant type thereon;
   (b) forming a refractory electrode layer on the upper surface of the insulating layer;
   (c) opening a first window through the refractory electrode layer;
   (d) forming a first mask layer at least in the first window and opening a second window in the first mask layer, the second window being located within the first window;
   (e) introducing into the wafer through the second window a first region of the opposite dopant type and of predetermined depth;
   (f) forming a second mask layer selectively located within the second window;
   (g) selectively removing the first mask layer, thereby opening a third window defined by the first window and the second mask layer located within the first window;
   (h) introducing into the wafer through the third window a second region of the same dopant type as the first region but of lesser depth;
   (i) introducing into the wafer through the third window a third region of the one dopant type and of lesser depth than the second region, the P-N junction thus-formed between the first and third regions terminating at the upper surface of the wafer beneath the second mask layer;
   (j) removing the second mask layer; and
   (k) metallizing the semiconductor material exposed as a result of removing the second mask layer, the metallization thereby implementing an electrical short across the P-N junction.

2. The invention according to claim 1 wherein the first mask layer comprises silicon nitride.

3. The invention according to claim 2 wherein the step of forming the silicon nitride first mask layer comprises low pressure chemical vapor deposition of a reaction product of silane and ammonia.

4. The invention according to claim 1 wherein the step of forming the second mask layer comprises growing the layer by thermal oxidation of wafer material.

5. The invention according to claim 1 wherein the semiconductor device comprises a MOSFET.

6. The invention according to claim 1 wherein the semiconductor device comprises an insulated gate rectifier.

7. The invention according to claim 1 wherein the one dopant type is N type and the opposite dopant type is P type.

8. The invention according to claim 7 wherein the semiconductor material comprises silicon.

9. The invention according to claim 8 wherein the step of forming the second mask layer comprises growing the layer by thermal oxidation of wafer material.

* * * * *